United States Patent [19]

Merlin et al.

[11] Patent Number: 5,552,574
[45] Date of Patent: Sep. 3, 1996

[54] METHOD FOR THE MARKING OF A CONNECTOR OF A CHIP CARD WITH A LASER BEAM

[75] Inventors: Pierre Merlin; Gérard Coiton, both of Venelles, France

[73] Assignee: Gemplus Card International

[21] Appl. No.: 111,136

[22] Filed: Aug. 24, 1993

[30] Foreign Application Priority Data

Aug. 26, 1992 [FR] France ............... 92 10296

[51] Int. Cl.⁶ ................. B23K 26/00; B23K 26/18
[52] U.S. Cl. ................. 219/121.69; 219/121.85; 219/121.61; 219/121.74
[58] Field of Search ............ 219/121.69, 121.68, 219/121.85, 121.61, 121.7, 121.71, 121.74, 121.76

[56] References Cited

U.S. PATENT DOCUMENTS

| | | | |
|---|---|---|---|
| 4,564,739 | 1/1986 | Mattelin | 219/121 LH |
| 4,652,722 | 3/1987 | Stone et al. | 219/121 LS |
| 4,675,498 | 6/1987 | Lemelson | 219/121 LB |
| 4,701,591 | 10/1987 | Masaki et al. | 219/121 LT |
| 4,735,670 | 4/1988 | Mauer et al. | 219/121 LM |
| 4,908,937 | 3/1990 | Coiton . | |
| 4,922,077 | 5/1990 | Gordon | 219/121.68 |
| 4,990,759 | 2/1991 | Coiton . | |
| 5,041,395 | 8/1991 | Steffen | 437/206 |
| 5,103,073 | 4/1992 | Danilov et al. | 219/121.68 |
| 5,157,235 | 10/1992 | Okumura et al. | 219/121.68 |
| 5,353,296 | 10/1994 | Koop | 372/55 |

FOREIGN PATENT DOCUMENTS

| | | |
|---|---|---|
| 2207459 | 6/1974 | France . |
| 3703809 | 8/1988 | Germany . |
| 1147531 | 4/1969 | United Kingdom . |
| 2240948 | 8/1991 | United Kingdom . |

OTHER PUBLICATIONS

"Beschriften mit Laserstrahlen", *Feinwerktechnik & Messtechnik*, F. Tuma, Jul. 1988, vol. 96, No. 7–8, pp. 308–310.

Japan Patent Abstract No. 58–53444, vol. 7, No. 141, Jun. 1983.

Japan Patent Abstract No. 59–207246, vol. 9, No. 77, Apr. 1985.

*Primary Examiner*—Mark H. Paschall
*Attorney, Agent, or Firm*—Nilles & Nilles, S.C.

[57] ABSTRACT

Disclosed is a method for the marking of particulars on a connector of a card called an electronic chip card, said connector having metal contacts with a given thickness. Said method comprises a step consisting of the etching, with a laser beam, of said particulars in the thickness of the metal contacts of the connector. Application to the marking of chip cards, bank cards, telephone cards etc.

12 Claims, 2 Drawing Sheets

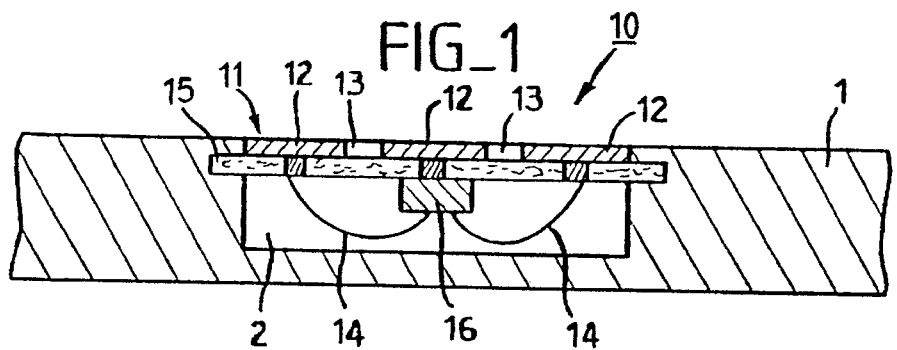
FIG_1
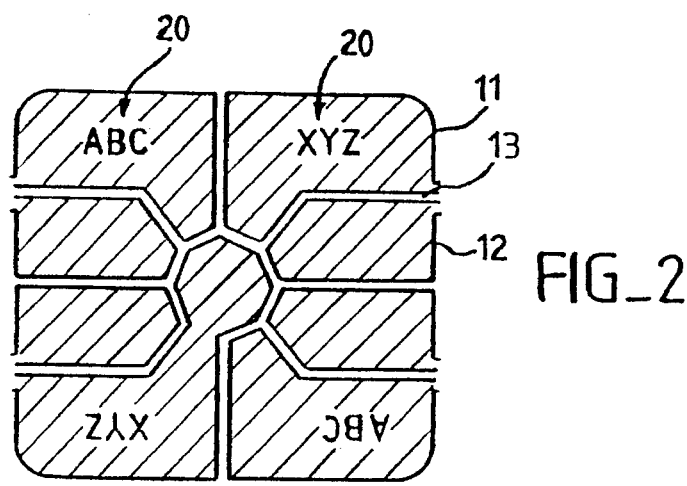
FIG_2
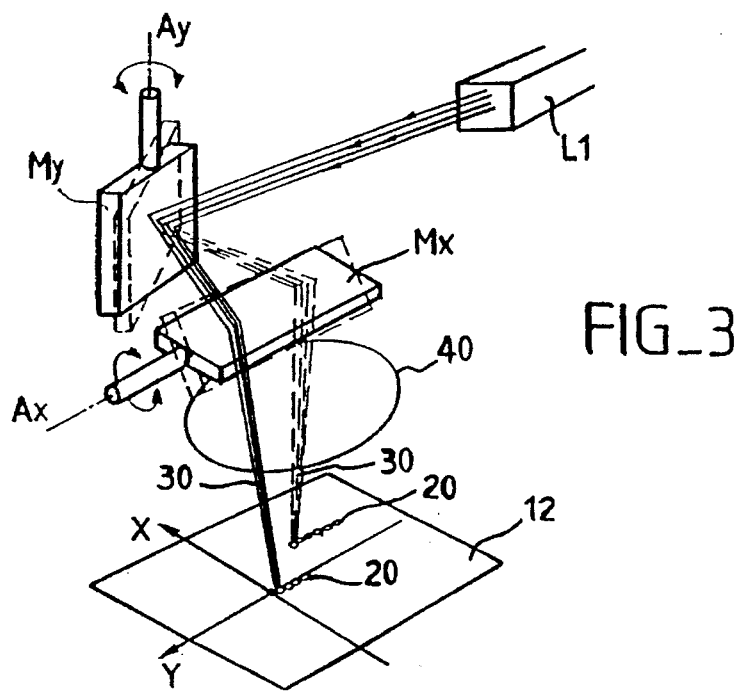
FIG_3

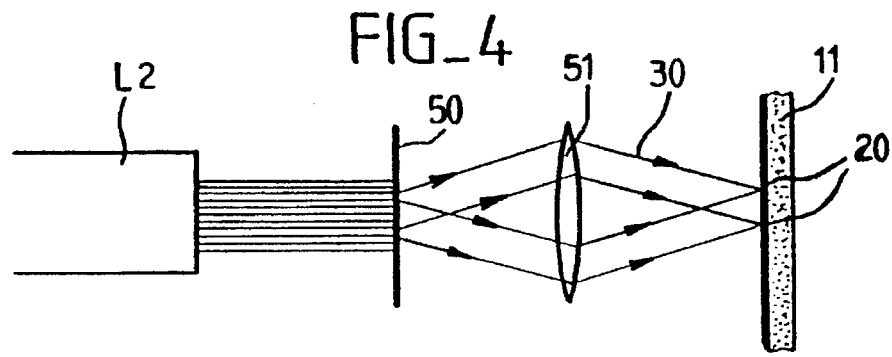
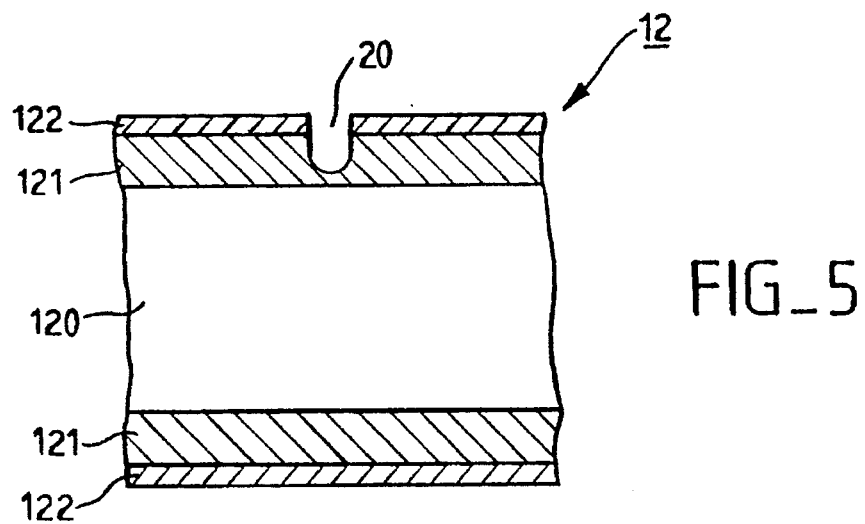
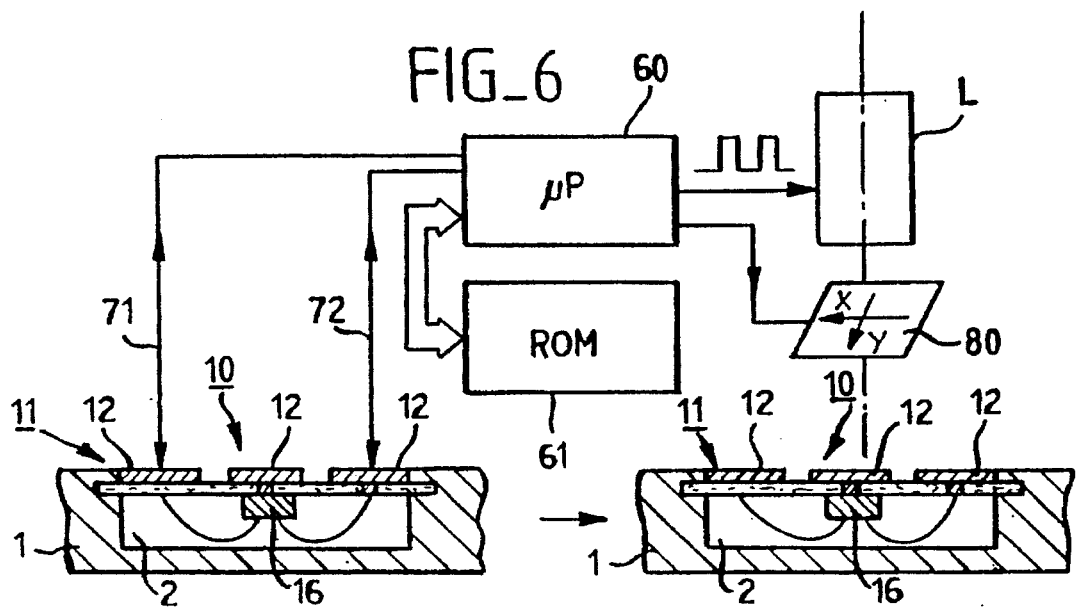

METHOD FOR THE MARKING OF A CONNECTOR OF A CHIP CARD WITH A LASER BEAM

BACKGROUND OF THE INVENTION

1. Field of the Invention

The present invention pertains to a method for the marking of information elements or particulars on a connector of a card known as an electronic chip card, said connector having metal contacts with a given thickness.

The invention can be applied in a particularly advantageous way to the marking of electronic chip cards such as bank cards or telephone cards for example, inter alia for the recording thereon of a security message or a manufacturer's identification.

In general, chip cards comprise micromodules that take the form of a supporting strip made of epoxy resin bearing, on one face, the electronic component (the chip) properly speaking and, on another face, an electrical connector constituted by metal contacts that are most usually made of copper, covered with a layer of nickel and a layer of gold. The micromodules are housed in cavities prepared in the thickness of the card, so as to leave said metal contacts accessible from the exterior.

2. Description of the Prior Art

At present, the micromodules bear no particulars of any kind whatsoever. Only the manufacturer's corporate name sometimes appears on the card itself. Especially as regards to security, the total absence of identification allows the possibility of interchanging the micromodule and the body of the card.

A certain number of methods could be envisaged in order to carry out the marking of particulars on a micromodule and, more specifically, on the connector of said micromodule.

Marking by printing for example would consist in depositing layers of ink on the metal elements of the connector. However, this method would raise two problems, i.e. firstly, a problem of electrical contacts getting deteriorated because the inks are generally not conductive and, secondly, a problem of a certain degree of sensitivity to wear and tear on the part of the embossed etchings.

Mechanical etching would be incompatible with an already assembled micromodule because of the brittleness of the chip. Besides, it is almost impossible to conceive of an industrial-scale solution for this application.

Photoetching by chemical means does not enable the etching to be controlled in depth and it is imperative that the coating of the metal contacts should not be penetrated too deeply.

Stamping, for its part, is not a process that can be carried out at any time whatsoever during the manufacturing process, which means that this technology has little flexibility.

Hence, the technical problem to be resolved by the object of the present invention is that of proposing a method for the marking of information elements or particulars on a connector of a card known as an electronic chip card, said connector having metal contacts of a given thickness, said method making it possible to obtain a lasting marking, without deterioration in the course of time, that would introduce no disturbance into the electrical contact and would not injure the electronic chip itself while at the same time retaining a high degree of flexibility, notably as regards the place of the marking operation in the card manufacturing cycle.

SUMMARY OF THE INVENTION

According to the present invention, the solution to the technical problem raised is one wherein said method comprises a step consisting of the etching, with a laser beam, of said particulars in the thickness of the electrical contacts of the connector.

Thus, the use of a laser etching operation provides the following advantages:

the message constituted by etched particulars is indelible;

the fineness of the etching avoids causing deterioration in the function of the metal contacts. The coating is not entirely removed, in order to prevent the exposure of the contacts to corrosion;

the etching of the particulars can be inserted at any stage in the manufacturing process; on the epoxy resin film before the chips are mounted, on the film with assembled chips, on cut-out micromodules or again on the cards themselves.

According to one particular mode of implementing the marking method which is the object of the invention, it is provided that, for the etching, a YAG type laser is used, emitting in the infrared range at the 1.06 μm wavelength. In this case, said laser beam is swept over the connector in a path that enables the drawing of the pattern corresponding to said particulars that are to be marked. The metal is evaporated under thermal effect, the total control achieved over the power of the beam providing for the possibility of limiting the depth of the etching to a very low value. Typically, the depth of the etching will be reduced so that the totality of the coating of the metal contacts is not removed. This configuration permits very great flexibility in the programming of the message: for example it permits units to be identified individually.

Examples that may be cited of particulars that can be marked on the card include a trade mark or the manufacturer's company name or again an identification designed to prevent any act of falsification. In the last-mentioned case, the invention provides for:

recognizing identification particulars memorized in said chip;

marking said identification particulars on the connector;

marking the identification particulars also on the card.

BRIEF DESCRIPTION OF THE DRAWINGS

The following description, made with reference to the appended drawings which are given as non-restrictive examples, will provide for a clear understanding of the content of the invention and of the way in which it can be achieved.

FIG. 1 shows a sectional view of an electronic chip card micromodule;

FIG. 2 is a top view corresponding to the sectional view of FIG. 1;

FIG. 3 is a schematic view in perspective of a marking device that implements the method of the invention by means of a YAG type laser.

FIG. 4 is a schematic sectional view of a marking device that implements the method of the invention by means of an excimer laser.

FIG. 5 is a sectional view of a metal contact after marking according to the method of the invention.

FIG. 6 is a drawing of a programmed marking device implementing the method of the invention.

MORE DETAILED DESCRIPTION

FIG. 1 shows a sectional view of a micromodule 10 placed inside a cavity 2 made in the body of a card 1 known as an electronic chip card. This micromodule 10 has a connector 11 constituted by a set of metal contacts 12 deposited on a support 15 made of epoxy resin. The various metal contacts 12 are separated from one another by insulator lines 13 and are connected to an electronic component 16, which is the chip of card 1, by conductive wires 14. As can be seen in FIG. 5, the metal contacts 13 may be formed by a main lager 120 of copper with a thickness of about 70 μm coated on each side with a 1 μm nickel layer 121 and a 0.1 μm gold layer 122. The coating of the cooper layer 120 with nickel and gold is used notably to prevent the corrosion of copper through contact with the ambient atmosphere.

FIGS. 3 and 4 give a schematic view of two devices for the implementation of a method for the marking of particulars, referenced 20 in FIGS. 2, 3 and 4, on the connector 11 of the electronic chip card 1, said method comprising a step that consists of the etching, with a laser beam 30, of said particulars 20 in the thickness of the metal contacts 12 of the connector 11.

In FIG. 3, the etching laser beam 30 comes from a YAG type laser L1 emitting an infrared radiation at a wavelength of 1.06 μm. The laser beam 30 is focused on metal contacts 12 by a lens 40 forming, in its focal plane, a image dot that can have a diameter of 70 μm. The etching is obtained by the sweeping, for example with an overlapping of 10 to 30 μm between successive image dots, of said laser beam 30 over the connector along a trajectory enabling the drawing of the pattern corresponding to said particulars that are to be marked. In the device shown in FIG. 3, the sweeping is achieved by means of two deviation mirrors or tilted mirrors Mx, My pivoting respectively about two orthogonal axes Ax and Ay. Naturally, the rotations of the mirrors Mx and My as well as their synchronization may be controlled digitally on the basis of the particulars 20 that are to be marked.

The device of FIG. 4 uses an excimer laser L2 emitting an ultraviolet radiation at the wavelength of 308 nm for example. An image of a mask 50, perforated according to a pattern corresponding to the particulars 30 that are to be marked, is formed on the connector by means of a lens 51.

The power of the laser beam used needs to be perfectly controlled so that, as indicated in FIG. 5, the depth of the etched particulars 20 does not penetrate the copper layer 120 but remains localized at the upper layers 121, 122 of nickel and gold, in order to prevent the corrosion of the contacts. To this end, there is provision, for example, for using a continuous device and for modulating said laser beam in order to limit the etching power. This modulation can be done by chopping the supply of the laser L, as can be seen in FIG. 6. It is clear, however, that other means can be implemented to modulate the laser beam, such as Kerr effect or Pockels effect electrooptical modulators.

In order to adjust the etching power as a function of the thickness of the metal contacts 12, it is possible to modify the cyclical ratio of the modulation. FIG. 6 shows that this adjusting operation can be done automatically by a microprocessor 60 controlled by a working program stored in a read-only memory 61.

Naturally, the step for the etching of the metal contacts 12 of the connector 11 can be done at any stage of the preparation of the card 1. In particular, it can be planned that the micromodule 10 comprising said connector and the associated electronic chip 16 are made prior to said etching step. Indeed, since the marking method according to the invention does not jeopardize the chip itself, its implementation can be considered even at an advanced stage of the manufacture of the card.

FIG. 6 shows that it is even possible to carry out the etching step after the micromodule 10 has been mounted on the body of the card 1. It can also be seen in FIG. 6 that, in this case, it is possible, by means of sensors 71, 72, to recognize identification particulars to be marked that are recorded electrically in the chip 16 and to transmit them to the microprocessor 60 which, apart from the modulation of the laser L, controls the means 80 for the sweeping of the laser beam 30 along x and y as a function of the particulars received. These identification elements may thus be etched on the metal contacts 12 of the micromodule 10 as well as on the very body of the card 1, thus forming a security means by which the interchanging of the micromodule 10 and the card 1 can be avoided.

What is claimed is:

1. A method for the marking of information elements, the method comprising the steps of providing an electronic chip card, said electronic chip card having a connector for communicating electrical signals, said connector having metal contacts for connecting to an electronic chip, said metal contacts having a main layer and a coating layer adjacent said main layer;

etching, with a laser beam, said information elements in said coating layer of said metal contacts of said connector; and preserving the main layer of the connector.

2. A method according to claim 1, further comprising the step of making a micromodule, said micromodule making step occurring prior to said etching step, said micromodule comprising said connector and said electronic chip.

3. A method according to claim 1 wherein, for the etching, a YAG type laser is used.

4. A method according to claim 1 wherein, for the etching, an excimer laser is used.

5. A method according to claim 1, wherein said etching step further comprises the step of sweeping said laser beam over said connector in a trajectory enabling the drawing of the pattern corresponding to said information elements that are to be marked.

6. A method according to claim 1, wherein said etching step further comprises the step of forming with said laser beam, an image of a mask perforated according to a pattern corresponding to the information elements that are to be marked.

7. A method according to claim 1, wherein said etching step further comprises the step of continuously emitting said laser beam, said laser beam being modulated in order to limit the etching power.

8. A method according to claim 7 wherein, for the modulation, the cyclical ratio of modulation is modified in order to adjust the etching power as a function of the thickness of said metal contacts of said connector.

9. A method according to claim 2, further comprising the step of affixing said micromodule to said card before said etching step.

10. A method according to claim 1, wherein further comprising the steps of recognizing information elements recorded in said chip; and marking said information elements on said connector.

11. A method according to claim 10, wherein said information elements are also marked on said electronic chip card.

12. A method according to claim 1, wherein said information elements are also marked on said electronic chip card.

* * * * *